(12) United States Patent
Suganuma

(10) Patent No.: US 11,189,612 B2
(45) Date of Patent: Nov. 30, 2021

(54) SEMICONDUCTOR DEVICE FOR DOWNSIZING AND REDUCING RESISTANCE AND INDUCTANCE

(71) Applicant: ROHM CO., LTD., Kyoto (JP)

(72) Inventor: Kenta Suganuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/996,136

(22) Filed: Aug. 18, 2020

(65) Prior Publication Data
US 2021/0057407 A1    Feb. 25, 2021

(30) Foreign Application Priority Data

Aug. 21, 2019  (JP) .............................. JP2019-151118

(51) Int. Cl.
| | | |
|---|---|---|
| *H01L 27/07* | (2006.01) | |
| *H01L 25/065* | (2006.01) | |
| *H01L 23/538* | (2006.01) | |
| *H01L 25/07* | (2006.01) | |

(Continued)

(52) U.S. Cl.
CPC ........ *H01L 27/0705* (2013.01); *H01L 23/522* (2013.01); *H01L 23/5383* (2013.01); *H01L 23/5389* (2013.01); *H01L 25/0652* (2013.01); *H01L 25/0657* (2013.01); *H01L 25/071* (2013.01); *H01L 25/074* (2013.01); *H01L 27/0694* (2013.01); *H01L 27/0788* (2013.01)

(58) Field of Classification Search
CPC . H01L 23/522; H01L 23/538; H01L 23/5383; H01L 23/5389; H01L 25/00652; H01L 25/0657; H01L 25/071; H01L 25/074; H01L 27/0688; H01L 27/0694; H01L 27/07; H01L 27/0705; H01L 27/0788
See application file for complete search history.

(56) References Cited

U.S. PATENT DOCUMENTS

| 5,532,512 A | * | 7/1996 | Fillion | ................. H01L 25/071 257/686 |
| 2001/0052641 A1 | * | 12/2001 | Kuo | ................. H01L 23/49562 257/686 |

(Continued)

FOREIGN PATENT DOCUMENTS

JP        2017534171 A     11/2017

*Primary Examiner* — Matthew E Warren
(74) *Attorney, Agent, or Firm* — Hamre, Schumann, Mueller & Larson, P.C.

(57) ABSTRACT

There is provided a semiconductor device including: a first semiconductor element including a first gate electrode, a first source electrode, and a first drain electrode; a second semiconductor element including a second gate electrode, a second source electrode, and a second drain electrode; a gate lead, a source lead, a first drain lead, and a second drain lead; and a resin part, wherein the first gate electrode and the first source electrode, and the first drain electrode are provided on opposite sides to each other in a first direction, wherein the second gate electrode and the second source electrode, and the second drain electrode are provided on opposite sides to each other in the first direction, wherein the first gate electrode and the second gate electrode are opposed to the first source electrode and the second source electrode, respectively, in the first direction.

16 Claims, 10 Drawing Sheets

(51) Int. Cl.
*H01L 23/522* (2006.01)
*H01L 27/06* (2006.01)

(56) References Cited

U.S. PATENT DOCUMENTS

| | | | | |
|---|---|---|---|---|
| 2005/0224945 A1* | 10/2005 | Saito | ............... | H01L 23/49575 |
| | | | | 257/686 |
| 2007/0108560 A1* | 5/2007 | Tang | ............... | H01L 24/37 |
| | | | | 257/666 |
| 2011/0081750 A1* | 4/2011 | Machida | ............... | H01L 23/49537 |
| | | | | 438/123 |
| 2011/0227207 A1* | 9/2011 | Yilmaz | ............... | H01L 23/49524 |
| | | | | 257/676 |
| 2014/0273344 A1* | 9/2014 | Terrill | ............... | H01L 21/4853 |
| | | | | 438/107 |

* cited by examiner

SEMICONDUCTOR DEVICE FOR DOWNSIZING AND REDUCING RESISTANCE AND INDUCTANCE

CROSS-REFERENCE TO RELATED APPLICATION(S)

This application is based upon and claims the benefit of priority from Japanese Patent Application No. 2019-151118, filed on Aug. 21, 2019, the entire contents of which are incorporated herein by reference.

TECHNICAL FIELD

The present disclosure relates to a semiconductor device.

BACKGROUND

There is a known example of a semiconductor device including a first MOSFET and a second MOSFET. In such a semiconductor device, the gate electrodes of the first MOSFET and the second MOSFET are connected to each other. N-channel type MOSFETs are used as the first MOSFET and the second MOSFET.

By providing a conductive member for electrically connecting the gate electrodes of the first MOSFET and the second MOSFET, there is a concern that the size of the semiconductor device may be increased. Further, there is a concern that the conductive member may increase resistance and inductance.

SUMMARY

Some embodiments of the present disclosure provide a semiconductor device capable of achieving downsizing and reduction of resistance and inductance.

According to one embodiment of the present disclosure, there is provided a semiconductor device including: a first semiconductor element including a first gate electrode, a first source electrode, and a first drain electrode; a second semiconductor element including a second gate electrode, a second source electrode, and a second drain electrode; a gate lead, a source lead, a first drain lead, and a second drain lead; and a resin part configured to cover the first semiconductor element and the second semiconductor element, and portions of the gate lead, the source lead, the first drain lead, and the second drain lead, wherein the first gate electrode and the first source electrode, and the first drain electrode are provided on opposite sides to each other in a first direction, wherein the second gate electrode and the second source electrode, and the second drain electrode are provided on opposite sides to each other in the first direction, wherein the first gate electrode and the second gate electrode are opposed to the first source electrode and the second source electrode, respectively, in the first direction, wherein the gate lead includes a gate bonding portion that is located between the first gate electrode and the second gate electrode in the first direction and is bonded to the first gate electrode and the second gate electrode, wherein the source lead includes a source bonding portion that is located between the first source electrode and the second source electrode in the first direction and is bonded to the first source electrode and the second source electrode, wherein the first drain lead has a first drain bonding portion bonded to the first drain electrode, and wherein the second drain lead has a second drain bonding portion bonded to the second drain electrode.

According to one embodiment of the present disclosure, the first semiconductor element and the second semiconductor element are P-channel type MOSFETs.

According to one embodiment of the present disclosure, the source lead includes a first source extension portion that extends from the source bonding portion to one side in a second direction that is perpendicular to the first direction.

According to one embodiment of the present disclosure, the source lead includes a second source extension portion that extends from the first source extension portion to one side in a third direction that is perpendicular to the first direction and the second direction.

According to one embodiment of the present disclosure, the source lead includes a source terminal portion that overlaps the first drain bonding portion in the third direction and projects from the resin part to one side in the third direction, and a source connection portion connected to the second source extension portion and the source terminal portion.

According to one embodiment of the present disclosure, the first drain lead includes a first drain terminal portion that extends from the first drain bonding portion to one side in the third direction and projects from the resin part to one side in the third direction.

According to one embodiment of the present disclosure, the source terminal portion and the first drain terminal portion overlap each other when viewed in the second direction.

According to one embodiment of the present disclosure, the gate lead includes a first gate extension portion that extends to the other side of the gate bonding portion in the third direction, and a gate terminal portion that projects from the resin part to the other side in the third direction.

According to one embodiment of the present disclosure, the second drain lead includes a second drain extension portion that extends from the second drain bonding portion to the other side in the third direction.

According to one embodiment of the present disclosure, the second drain lead includes a second drain terminal portion that overlaps the first drain bonding portion in the third direction and projects from the resin part to the other side in the third direction, and a second drain connection portion connected to the second drain extension portion and the second drain terminal portion.

According to one embodiment of the present disclosure, the gate terminal portion and the second drain terminal portion overlap each other when viewed in the second direction. According to one embodiment of the present disclosure, the first drain lead includes a die bonding portion located on one side of the first drain bonding portion in the second direction, and the semiconductor device further includes a control element including a first control electrode that is bonded to the die bonding portion and is located on an opposite side to the die bonding portion in the first direction.

According to one embodiment of the present disclosure, the gate lead includes a second gate extension portion that extends from the gate bonding portion to the other side in the second direction, and a control bonding portion connected to the second gate extension portion and bonded to the first control electrode, and the first gate extension portion is connected to the control bonding portion.

According to one embodiment of the present disclosure, the control element includes at least one second control electrode located on one side of the first control electrode in the third direction, and wherein the semiconductor device further includes: at least one control lead located on one side of the first drain lead in the second direction; and at least one control wire connected to the at least one second control electrode and the at least one control lead.

According to one embodiment of the present disclosure, the at least one second control electrode includes a plural number of second control electrodes, the at least one control lead includes a plural number of control leads, and the at least one control wire includes a plural number of control wires.

According to one embodiment of the present disclosure, any one of the plural number of control leads has a position in the third direction overlapping the first control electrode.

According to one embodiment of the present disclosure, the first source electrode is smaller than the first drain electrode.

According to one embodiment of the present disclosure, the second source electrode is smaller than the second drain electrode.

Other features and advantages of the present disclosure will be more apparent from the detailed description given below with reference to the accompanying drawings.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
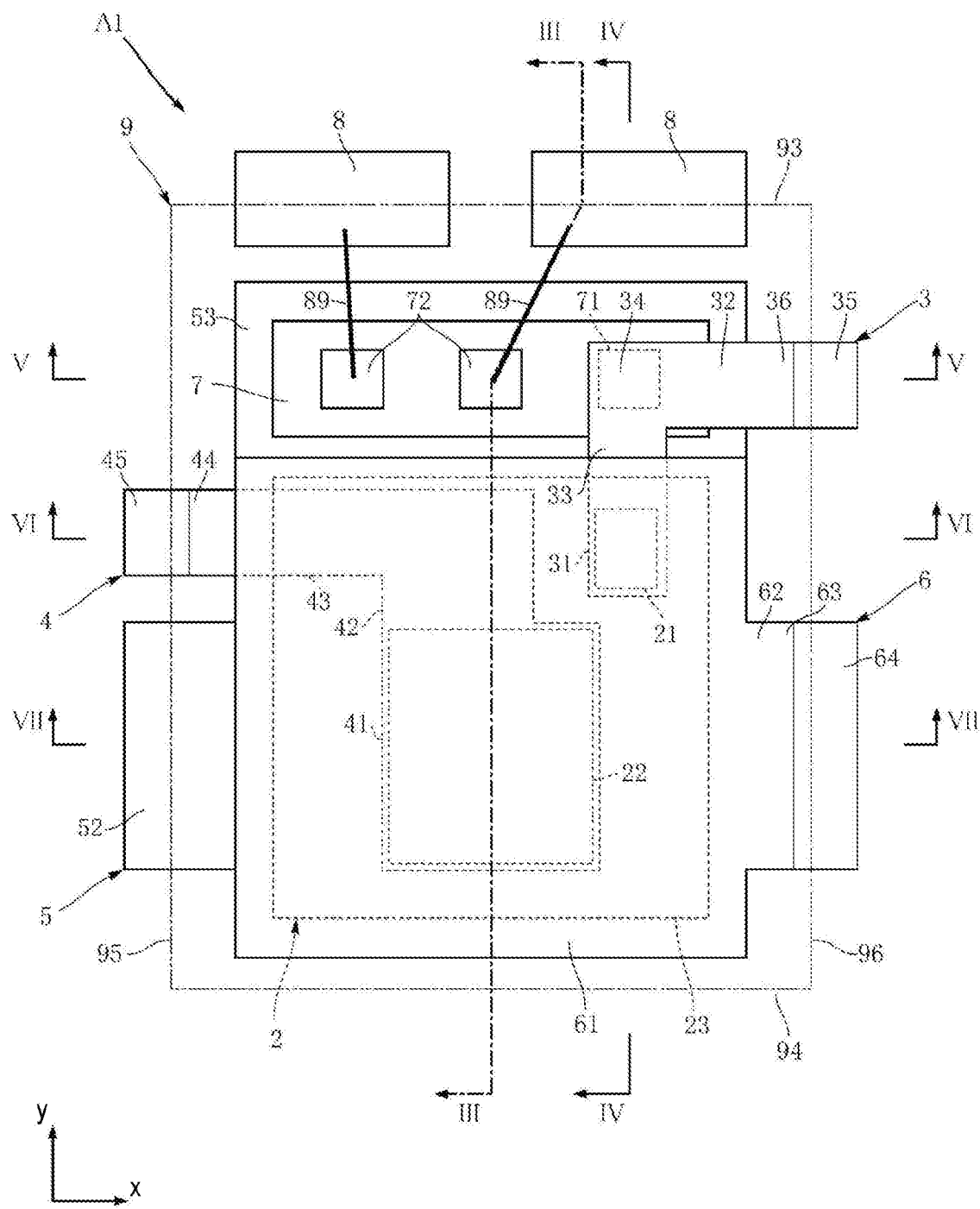
FIG. 1 is a plane view showing a semiconductor device according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Preferred embodiments of the present disclosure will now be described in detail with reference to the drawings.

The terms "first," "second," "third," and the like in the present disclosure are merely used as labels and are not intended to assign a sequence to those objects.

First Embodiment

FIGS. 1 to 8 show a semiconductor device according to a first embodiment of the present disclosure. The semiconductor device A1 of the present embodiment includes a first semiconductor element 1, a second semiconductor element 2, a gate lead 3, a source lead 4, a first drain lead 5, a second drain lead 6, a control element 7, a control lead 8, and a resin part 9. The application of the semiconductor device A1 is not particularly limited, and may be, for example, protection of a lithium battery.

Figure 2:
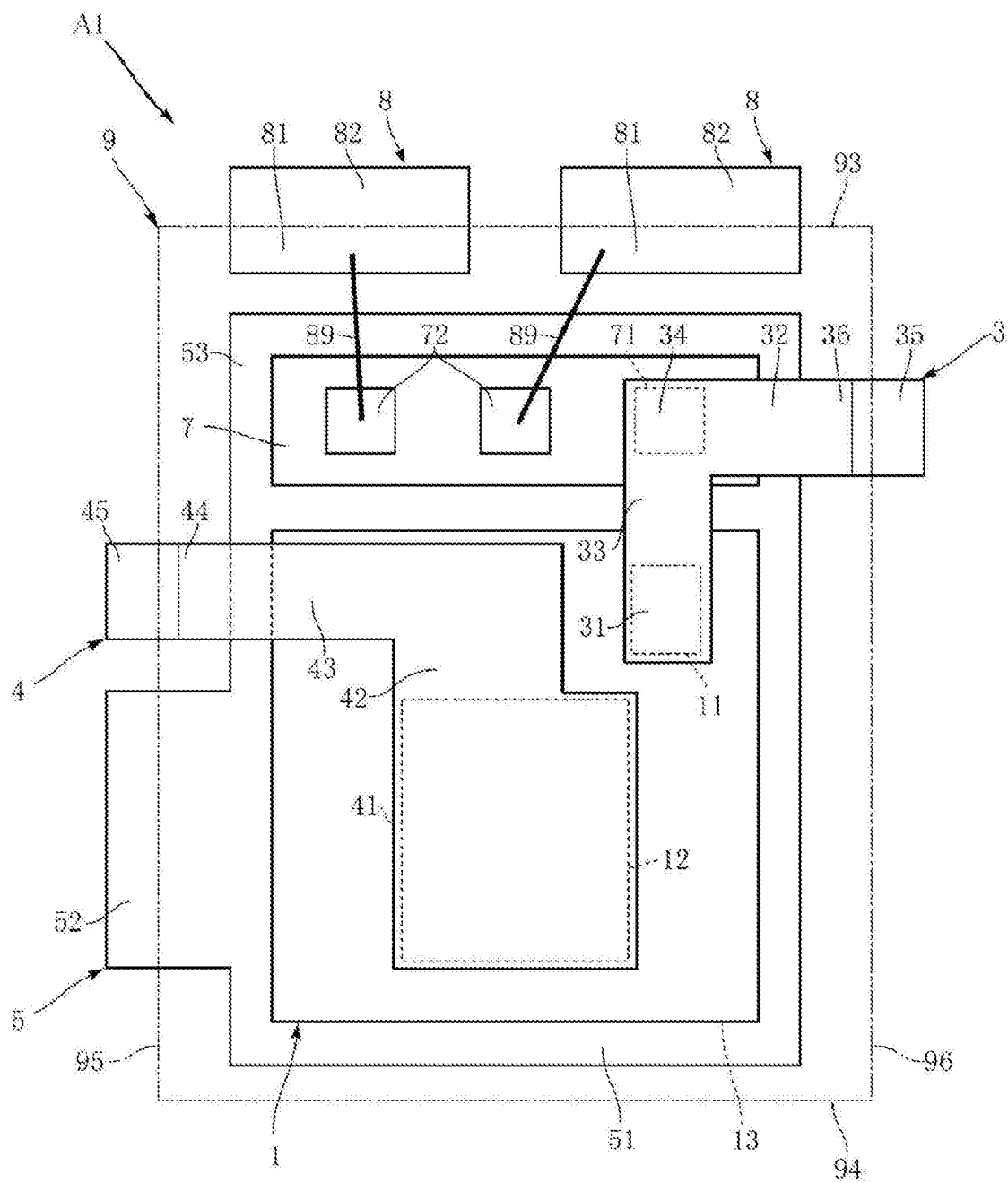
FIG. 2 is a plane view showing main parts of the semiconductor device according to the first embodiment of the present disclosure.
Figure 3:
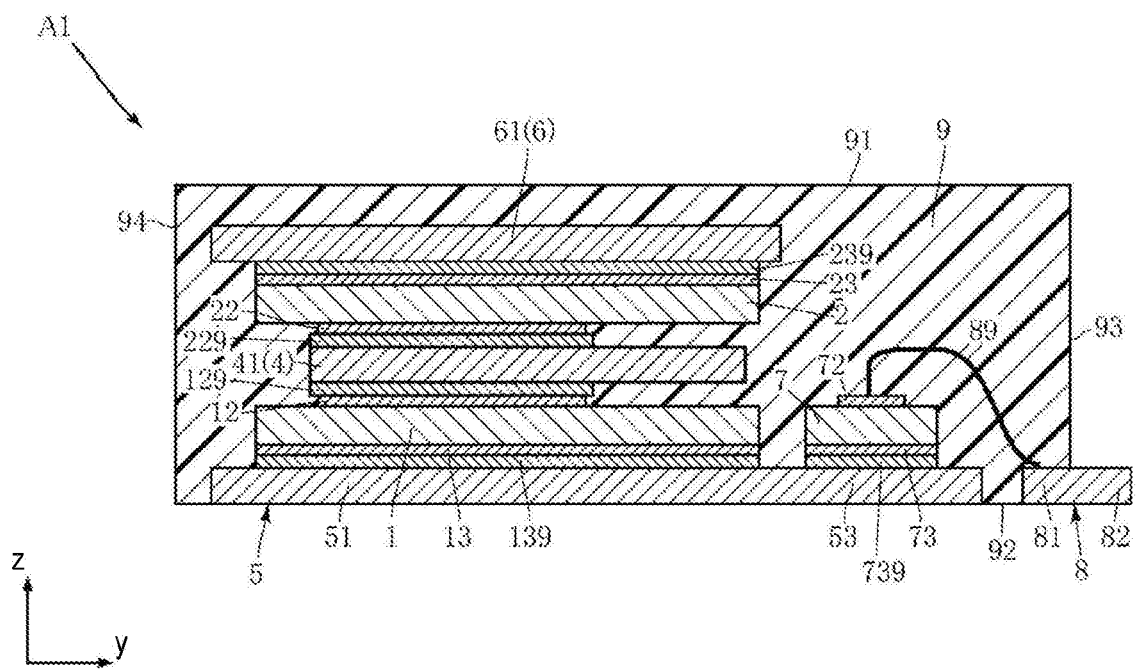
FIG. 3 is a cross-sectional view taken along line in FIG. 1.
Figure 4:
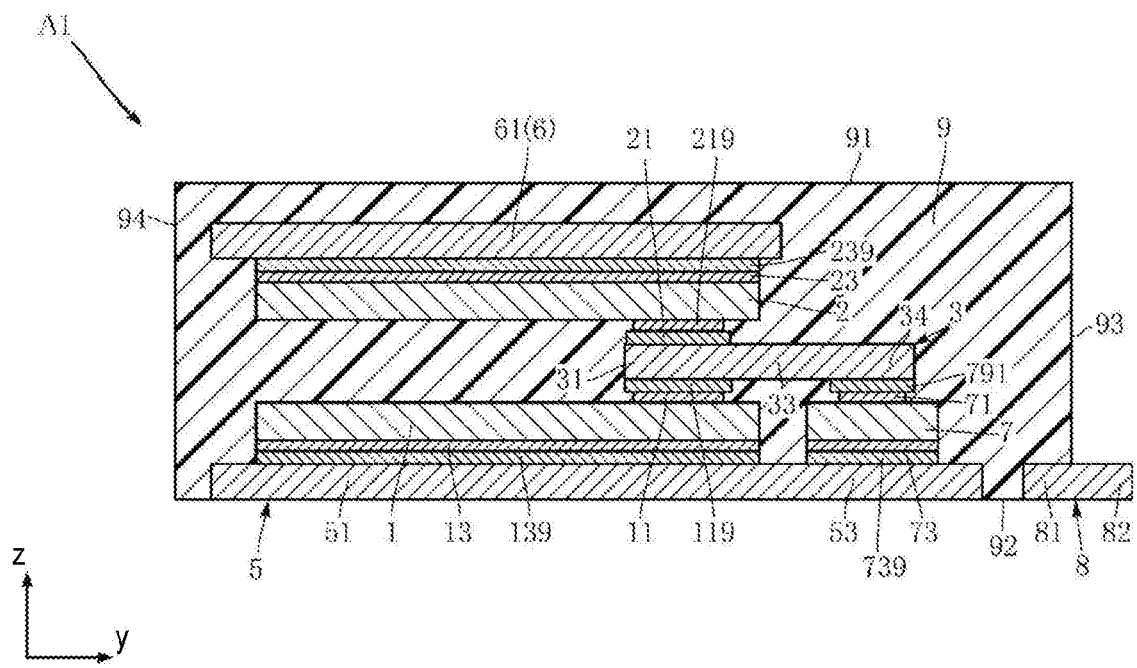
FIG. 4 is a cross-sectional view taken along line IV-IV in FIG. 1.
Figure 5:
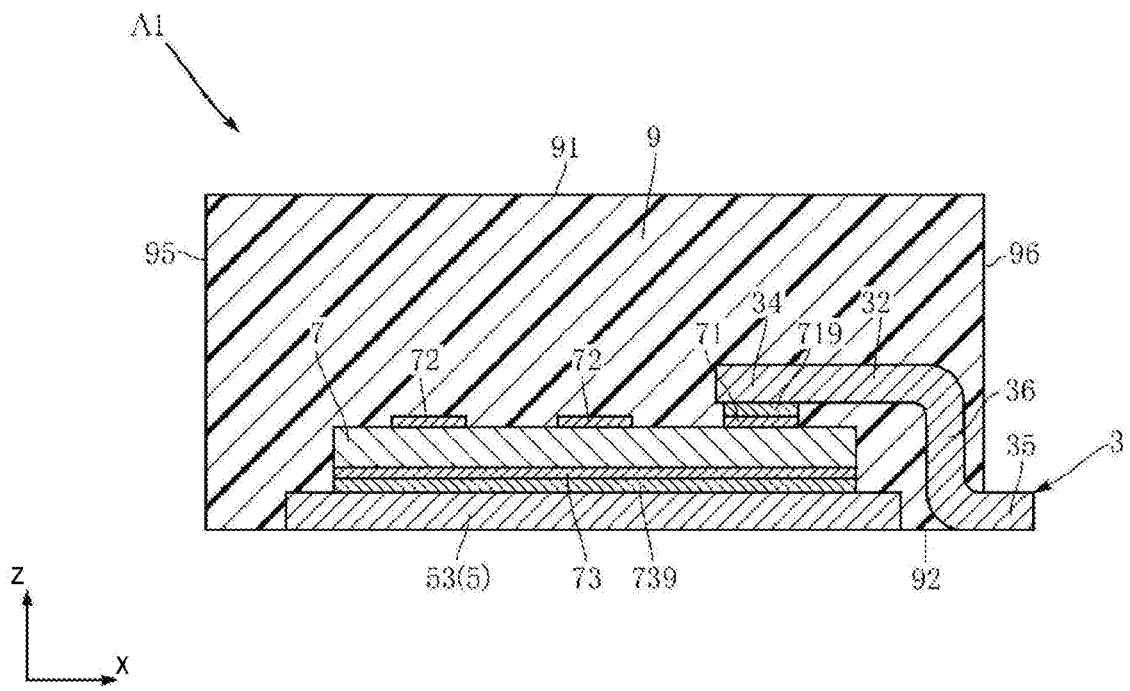
FIG. 5 is a cross-sectional view taken along line V-V in FIG. 1.
Figure 6:
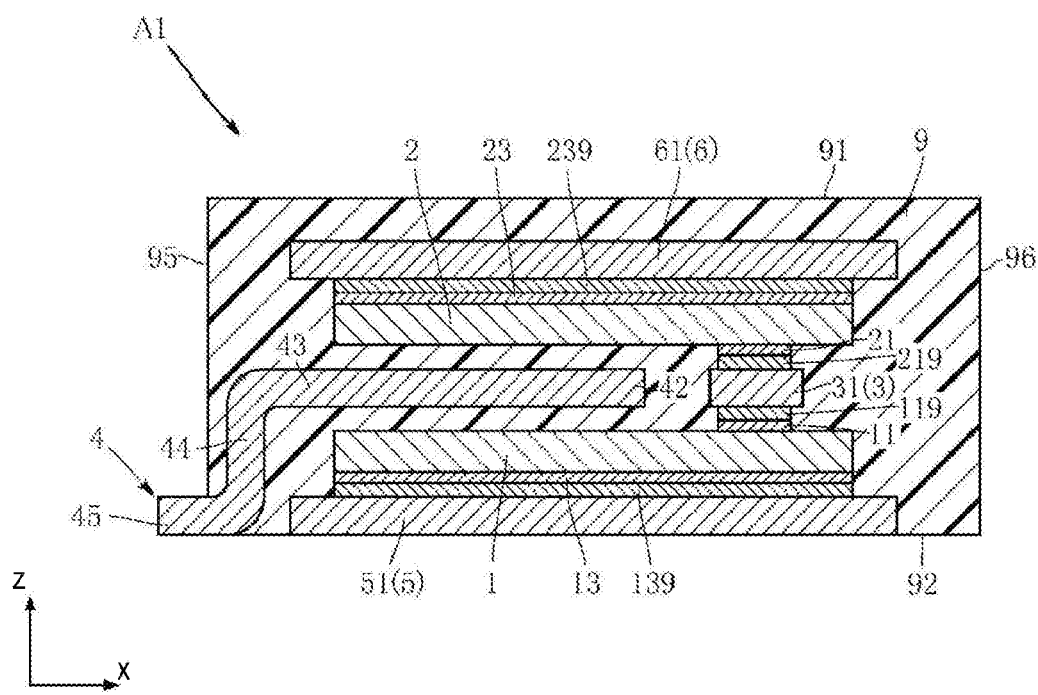
FIG. 6 is a cross-sectional view taken along line VI-VI in FIG. 1.
Figure 7:
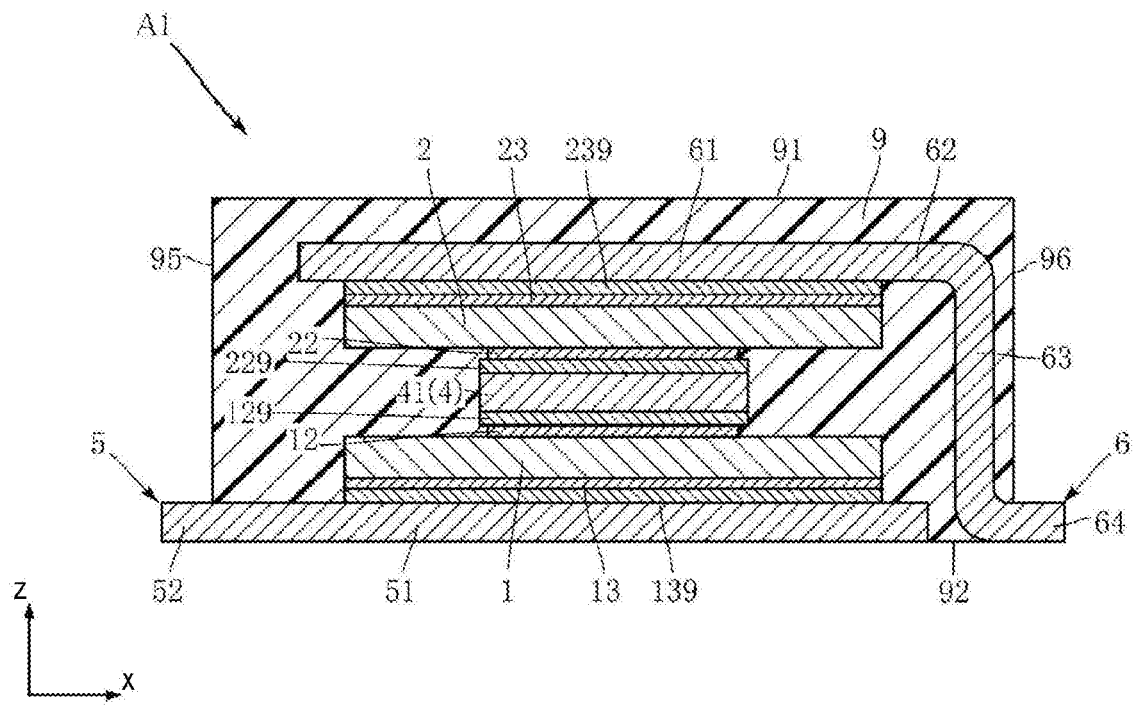
FIG. 7 is a cross-sectional view taken along line VII-VII in FIG. 1.
Figure 8:
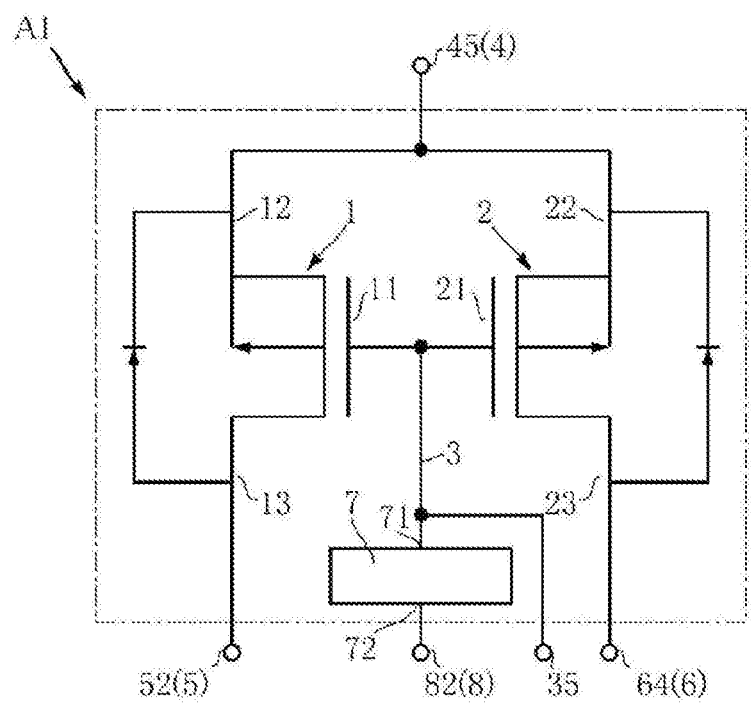
FIG. 8 is a circuit diagram showing the semiconductor device according to the first embodiment of the present disclosure.
Figure 9:
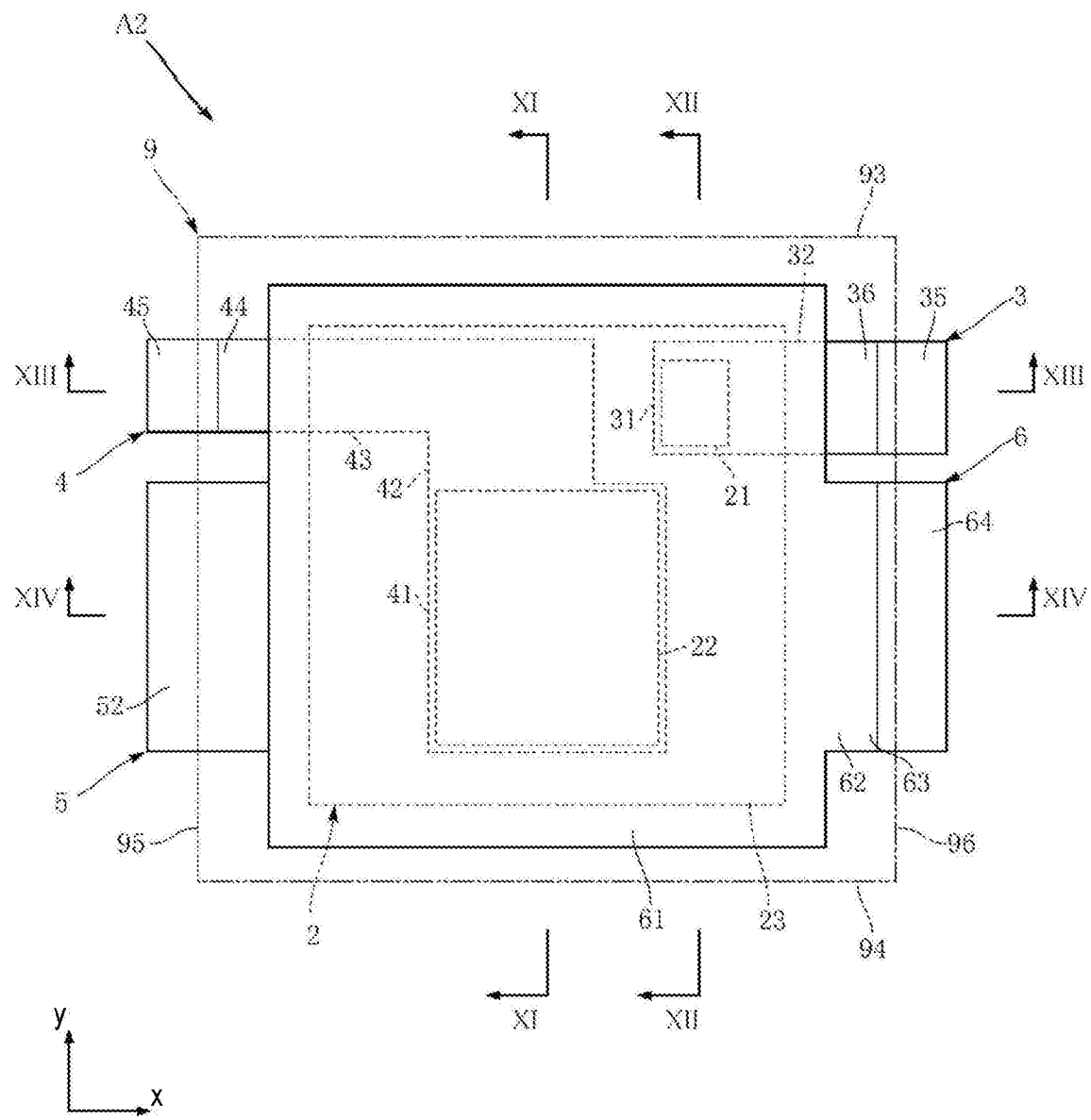
FIG. 9 is a plane view showing a semiconductor device according to a second embodiment of the present disclosure.
Figure 10:
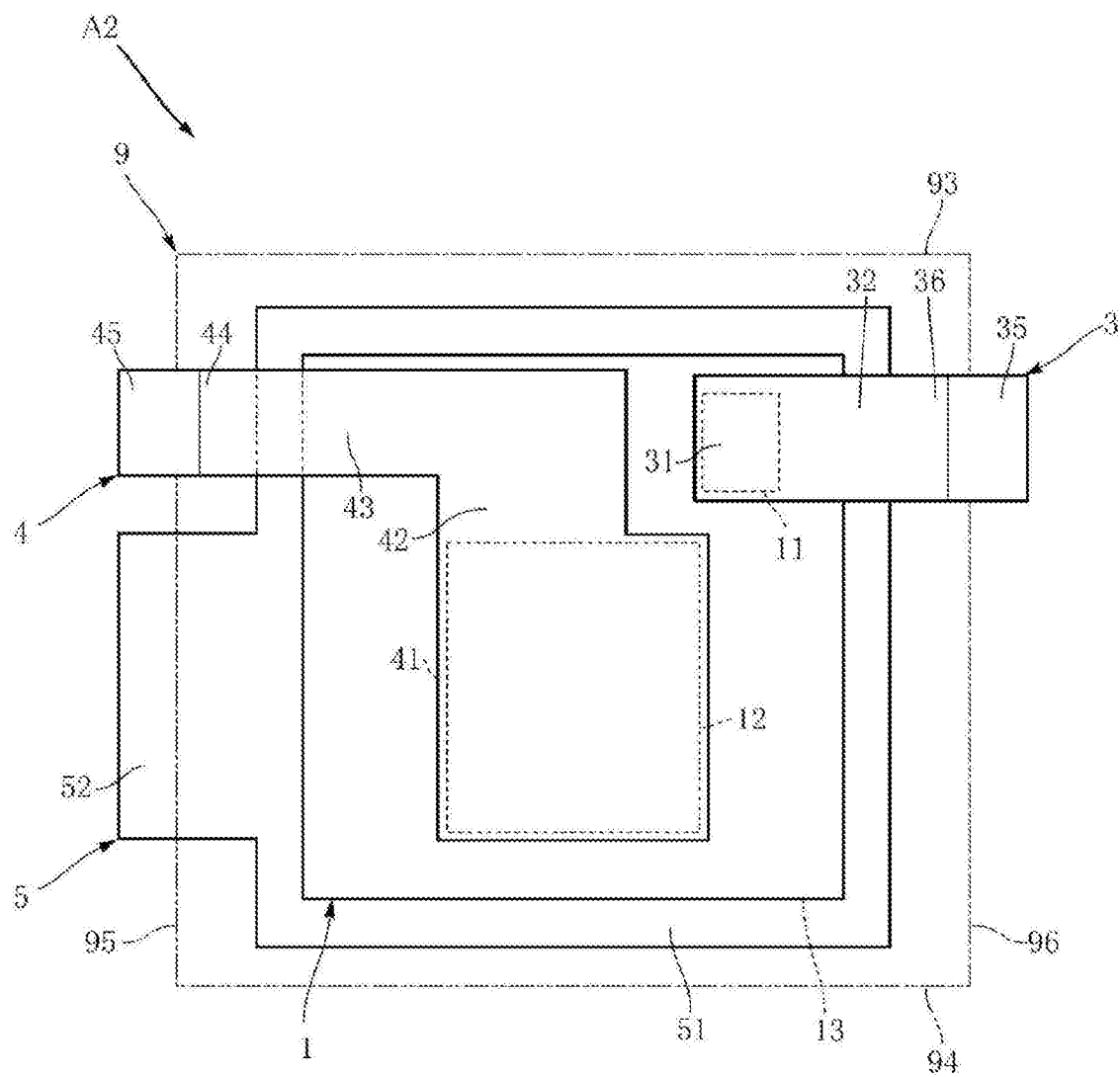
FIG. 10 is a plane view showing main parts of a semiconductor device according to a third embodiment of the present disclosure.
Figure 11:
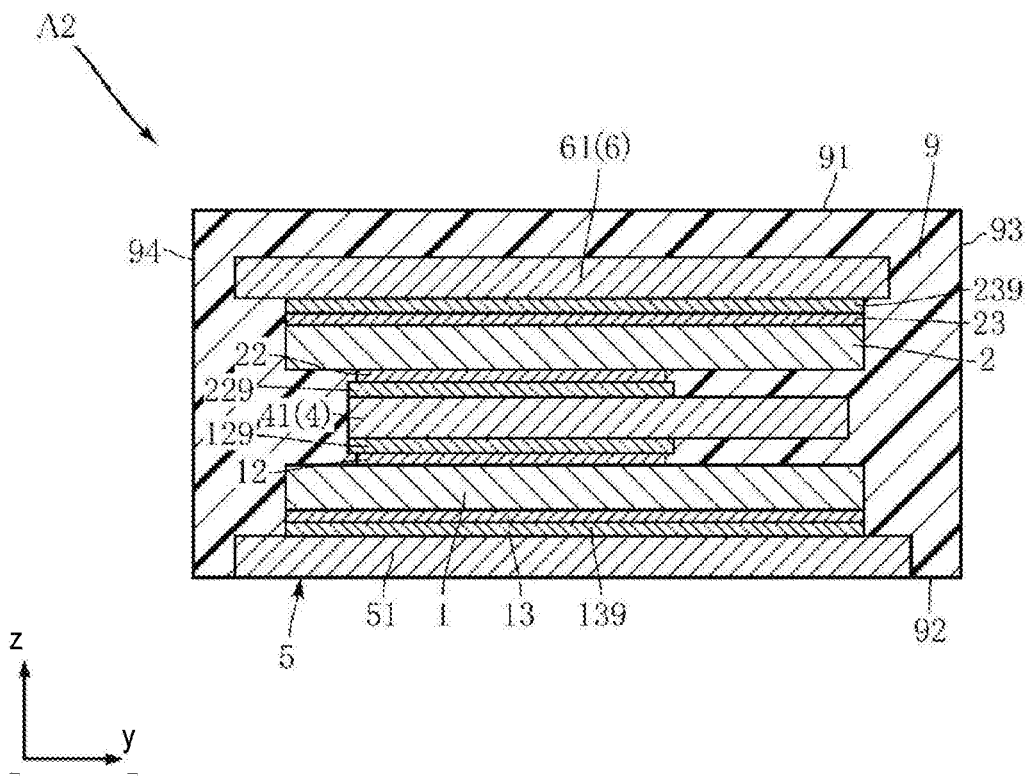
FIG. 11 is a cross-sectional view taken along line XI-XI in FIG. 9.
Figure 12:
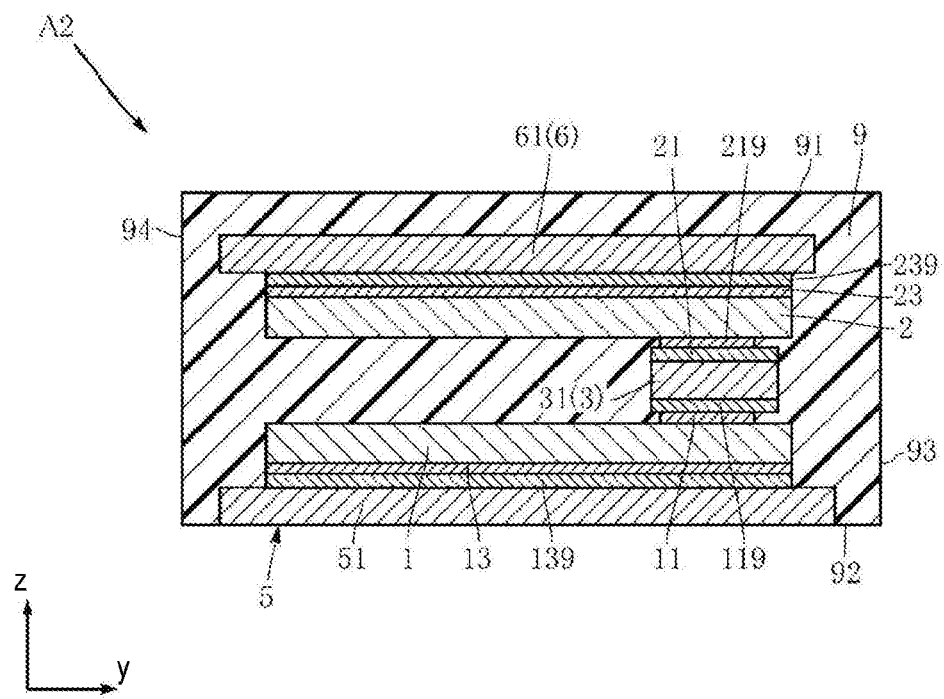
FIG. 12 is a cross-sectional view taken along line XII-XII in FIG. 9.
Figure 13:
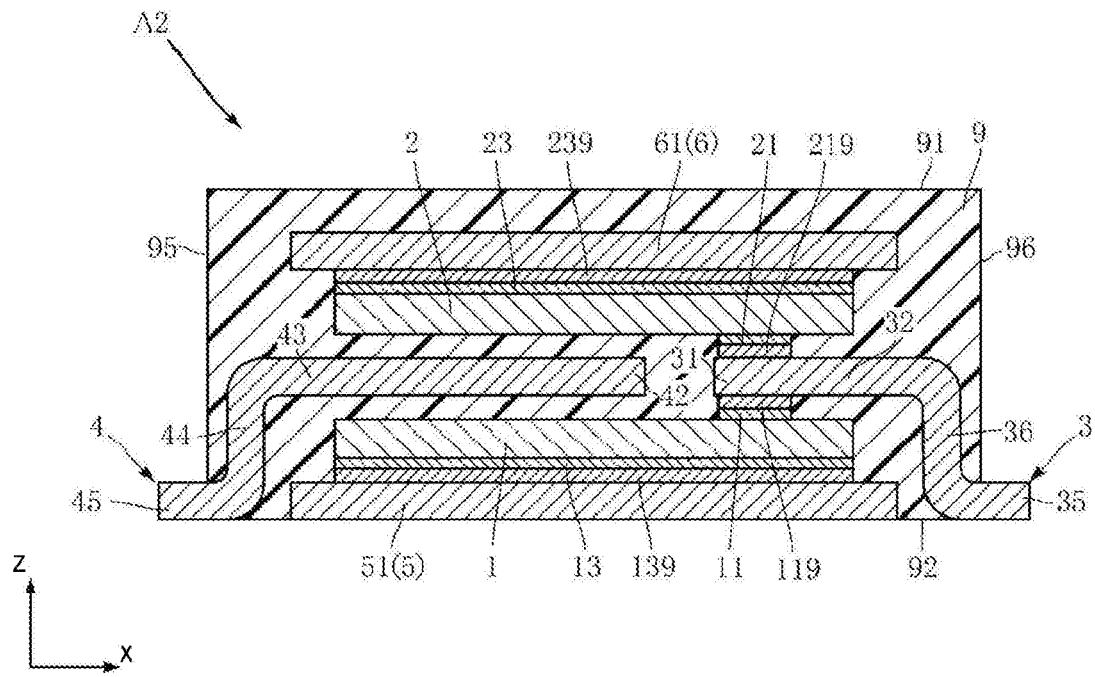
FIG. 13 is a cross-sectional view taken along line XIII-XIII in FIG. 9.
Figure 14:
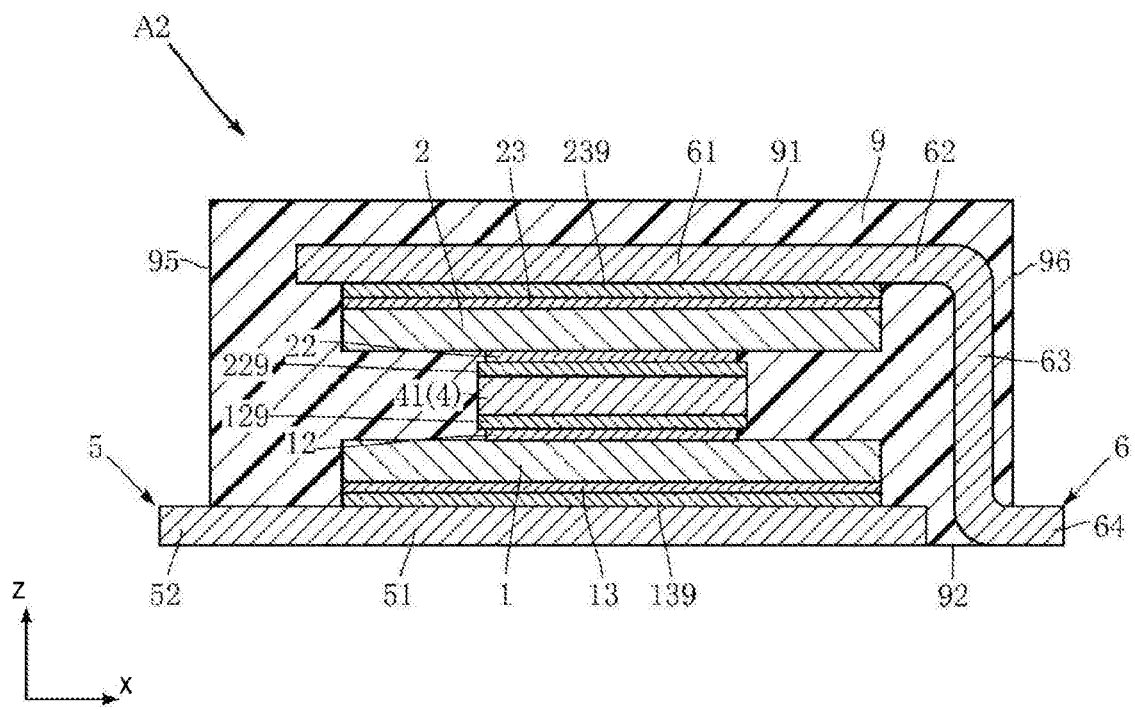
FIG. 14 is a cross-sectional view taken along line XIV-XIV in FIG. 9.
Figure 15:
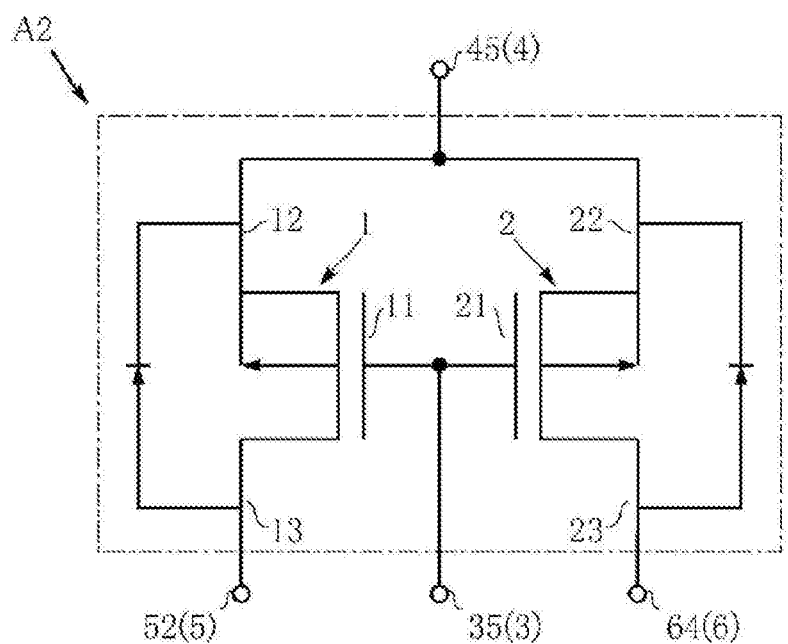
FIG. 15 is a circuit diagram showing the semiconductor device according to the second embodiment of the present disclosure.

FIG. 1 is a plane view showing the semiconductor device A1. FIG. 2 is a plane view showing main parts of the semiconductor device A1. FIG. 3 is a cross-sectional view taken along line in FIG. 1. FIG. 4 is a cross-sectional view taken along line IV-IV in FIG. 1. FIG. 5 is a cross-sectional view taken along line V-V in FIG. 1. FIG. 6 is a cross-sectional view taken along line VI-VI in FIG. 1. FIG. 7 is a cross-sectional view taken along line VII-VII in FIG. 1. FIG. 8 is a circuit diagram showing the semiconductor device A1. In FIG. 2, the second drain lead 6 and the second semiconductor element 2 are omitted for convenience of understanding. Further, in these drawings, a z-direction corresponds to a first direction in the present disclosure, a y-direction corresponds to a second direction in the present disclosure, and an x-direction corresponds to a third direction of the present disclosure.

<First Semiconductor Element 1>

The first semiconductor element 1 is an element that performs a switching function in the semiconductor device A1. The type and configuration of the first semiconductor element 1 are not particularly limited. In the present embodiment, a P-channel MOSFET is used as the first semiconductor element 1. The first semiconductor element 1 has a first gate electrode 11, a first source electrode 12, and a first drain electrode 13.

In the first semiconductor element 1, the first gate electrode 11 and the first source electrode 12 are provided to face one side of the first semiconductor element 1 in the z direction. The first drain electrode 13 is provided to face the other side in the z-direction opposite to the first gate electrode 11 and the first source electrode 12. In the illustrated example, the first gate electrode 11 is smaller than the first source electrode 12 when viewed in the z-direction. Further, the first drain electrode 13 overlaps the first gate electrode 11 and the first source electrode 12 when viewed in the z-direction.

<Second Semiconductor Element 2>

The second semiconductor element 2 is an element that performs a switching function together with the first semiconductor element 1 in the semiconductor device A1. The type and configuration of the second semiconductor element 2 is not particularly limited. In the present embodiment, a P-channel MOSFET is used as the second semiconductor element 2. The second semiconductor element 2 has a second gate electrode 21, a second source electrode 22, and a second drain electrode 23.

The second semiconductor element 2 is arranged on one side with respect to the first semiconductor element 1 in the z-direction. The second gate electrode 21 and the second source electrode 22 are provided to face the other side in the z-direction. The second gate electrode 21 overlaps and faces the first gate electrode 11 when viewed in the z-direction. In addition, the second source electrode 22 overlaps and faces the first source electrode 12 when viewed in the z-direction. The second drain electrode 23 is provided to face one side in the z-direction opposite to the second gate electrode 21 and the second source electrode 22. In the illustrated example, the second gate electrode 21 is smaller than the second source electrode 22 when viewed in the z-direction. Further, the second drain electrode 23 overlaps the second gate electrode 21 and the second source electrode 22 when viewed in the z-direction.

<Control Element 7>

The control element 7 is an element that controls a voltage applied to the first gate electrode 11 of the first semiconductor element 1 and the second gate electrode 21 of the second semiconductor element 2, and is a so-called gate driver. The control element 7 has a first control electrode 71, a second control electrode 72, and a metal layer 73. The first control electrode 71 is provided on one side of the control element 7 in the z-direction. The second control electrode 72 is provided on one side of the control element 7 in the z-direction, and is arranged on one side with respect to the first control electrode 71 in the x-direction. In the illustrated example, the control element 7 has two second control electrodes 72. The metal layer 73 is provided on the other side of the control element 7 in the z-direction. The metal layer 73 may function as an electrode used for inputting and outputting a control current, or may be an insulated metal layer for performing bonding described later.

<Resin Part 9>

The resin part 9 covers the first semiconductor element 1, the second semiconductor element 2 and the control element 7, and portions of the gate lead 3, the source lead 4, the first drain lead 5, and the second drain lead 6. The resin part 9 is made of an insulating material, for example, black epoxy resin. The resin part 9 has, for example, a first resin part surface 91, a second resin part surface 92, a third resin part surface 93, a fourth resin part surface 94, a fifth resin part surface 95, and a sixth resin part surface 96.

The first resin part surface 91 is a surface facing one side in the z-direction. The second resin part surface 92 is a surface facing the other side in the z-direction. The third resin part surface 93 is a surface facing one side in the y-direction. The third resin part surface 93 is connected to the first resin part surface 91 and the second resin part surface 92. The fourth resin part surface 94 is a surface facing the other side in the y-direction. The fourth resin part surface 94 is connected to the first resin part surface 91 and the second resin part surface 92. The fifth resin part surface 95 is a surface facing one side in the x-direction. The fifth resin part surface 95 is connected to the first resin part surface 91 and the second resin part surface 92, and is also connected to the third resin part surface 93 and the fourth resin part surface 94. The sixth resin part surface 96 is a surface facing the other side in the x-direction. The sixth resin part surface 96 is connected to the first resin part surface 91 and the second resin part surface 92, and is also connected to the third resin part surface 93 and the fourth resin part surface 94.

<First Drain Lead 5>

The first drain lead 5 is a lead for electrically connecting the first drain electrode 13 of the first semiconductor element 1 and an outside, and is made of a metal such as Cu, Ni, Fe, or the like. The first drain lead 5 has a first drain bonding portion 51, a first drain terminal portion 52, and a die bonding portion 53.

The first drain bonding portion 51 is located on the other side with respect the first drain electrode 13 of the first semiconductor element 1 in the z-direction, and faces the first drain electrode 13. The first drain bonding portion 51 overlaps the first drain electrode 13 when viewed in the z-direction. The first drain bonding portion 51 is conductively bonded to the first drain electrode 13 via a bonding layer 139. The bonding layer 139 is made of a conductive bonding material, for example, solder, Ag paste, or the like. A surface of the first drain bonding portion 51 facing the other side in the z-direction is exposed from the second resin part surface 92 of the resin part 9.

The first drain terminal portion 52 extends from the first drain bonding portion 51 to one side in the x-direction and projects from the fifth resin part surface 95 of the resin part 9 to the one side in the x-direction. The first drain terminal portion 52 is used as a terminal connected to an external circuit when the semiconductor device A1 is mounted, or the like.

The die bonding portion 53 is connected to one side of the first drain bonding portion 51 in the y-direction. The metal layer 73 of the control element 7 is bonded to the die bonding portion 53 via a bonding layer 739. The bonding layer 739 may be a conductive bonding material or an insulating bonding material. In the illustrated example, the first drain lead 5 has a flat shape along the x-direction and the y-direction.

<Second Drain Lead 6>

The second drain lead 6 is a lead for electrically connecting the second drain electrode 23 of the second semiconductor element 2 and an outside, and is made of a metal such as Cu, Ni, Fe, or the like. The second drain lead 6 has a second drain bonding portion 61, a second drain extension portion 62, a second drain connection portion 63, and a second drain terminal portion 64.

The second drain bonding portion 61 is located on one side with respect to the second drain electrode 23 of the second semiconductor element 2 in the z-direction, and faces the second drain electrode 23. The second drain bonding portion 61 overlaps the second drain electrode 23 when viewed in the z-direction. The second drain bonding portion 61 is conductively bonded to the second drain electrode 23 via a bonding layer 239. The bonding layer 239 is made of a conductive bonding material, for example, solder, Ag paste, or the like. A surface of the second drain bonding portion 61 facing one side in the z-direction is covered with the resin part 9.

The second drain extension portion 62 extends from the second drain bonding portion 61 to the other side in the x-direction. The second drain extension portion 62 is located on one side of the sixth resin part surface 96 of the resin part 9 in the x-direction and is covered with the resin part 9.

The second drain connection portion 63 extends from an end of the second drain extension portion 62 on the other side in the x-direction to the other side in the z-direction, and connects the second drain extension portion 62 and the second drain terminal portion 64. The second drain terminal portion 64 extends from an end of the second drain connection portion 63 on the other side in the z-direction to the other side in the x-direction, and projects from the sixth resin part surface 96 of the resin part 9. The second drain terminal portion 64 is used as a terminal connected to an external circuit when the semiconductor device A1 is mounted, or the like. The second drain terminal portion 64 overlaps the first drain bonding portion 51 of the first drain lead 5 when viewed in the x-direction.

<Gate Lead 3>

The gate lead 3 is a lead for electrically connecting the first gate electrode 11 of the first semiconductor element 1 and the second gate electrode 21 of the second semiconductor element 2 to an outside. In addition, the gate lead 3 connects the first drain electrode 13 and the second drain electrode 23 to the control element 7 in the present embodiment. The gate lead 3 of the present embodiment has a gate bonding portion 31, a first gate extension portion 32, a second gate extension portion 33, a control bonding portion 34, a gate terminal portion 35, and a gate connection portion 36.

The gate bonding portion 31 is located between the first gate electrode 11 of the first semiconductor element 1 and the second gate electrode 21 of the second semiconductor element 2 in the z-direction. The gate bonding portion 31 overlaps the first gate electrode 11 and the second gate electrode 21 when viewed in the z-direction. The first gate electrode 11 is conductively bonded to the gate bonding portion 31 via a bonding layer 119, and the second gate electrode 21 is conductively bonded to the gate bonding portion 31 via a bonding layer 219. The bonding layer 119 and the bonding layer 219 are made of a conductive bonding material, for example, solder, Ag paste, or the like.

The second gate extension portion 33 extends from the gate bonding portion 31 to one side in the y-direction. The control bonding portion 34 is connected to one side of the second gate extension portion 33 in the y-direction. The control bonding portion 34 is located on one side with respect to the first control electrode 71 of the control element 7 in the z-direction, and faces the first control electrode 71. The control bonding portion 34 is conductively bonded to the first control electrode 71 via a bonding layer 719. The bonding layer 719 is made of a conductive bonding material, for example, solder, Ag paste, or the like.

The first gate extension portion 32 extends from the control bonding portion 34 to the other side in the x-direction. The gate connection portion 36 extends from an end of the first gate extension portion 32 on the other side in the x-direction to the other side in the z-direction, and connects the first gate extension portion 32 and the gate terminal portion 35. The gate terminal portion 35 extends from an end of the gate connection portion 36 on the other side in the z-direction to the other side in the x-direction, and projects from the sixth resin part surface 96 of the resin part 9. The gate terminal portion 35 is used as a terminal connected to an external circuit when the semiconductor device A1 is mounted, or the like. The gate terminal portion 35 overlaps the die bonding portion 53 of the first drain lead 5 when viewed in the x-direction. In addition, the gate terminal portion 35 overlaps the second drain terminal portion 64 of the second drain lead 6 when viewed in the y-direction.

<Source Lead 4>

The source lead 4 is a lead for electrically connecting the first source electrode 12 of the first semiconductor element 1 and the second source electrode 22 of the second semiconductor element 2 to an outside. In the present embodiment, the source lead 4 has a source bonding portion 41, a first source extension portion 42, a second source extension portion 43, a source connection portion 44, and a source terminal portion 45.

The source bonding portion 41 is located between the first source electrode 12 of the first semiconductor element 1 and the second source electrode 22 of the second semiconductor element 2 in the z-direction. The source bonding portion 41 overlaps the first source electrode 12 and the second source electrode 22 when viewed in the z-direction. The first source electrode 12 is conductively connected to the source bonding portion 41 via a bonding layer 129, and the second source electrode 22 is conductively bonded to the source bonding portion 41 via a bonding layer 229. The bonding layer 129 and the bonding layer 229 are made of a conductive bonding material, for example, solder, Ag paste, or the like.

The first source extension portion 42 extends from the source bonding portion 41 to one side in the y-direction. The second source extension portion 43 is connected to one side of the first source extension portion 42 in the x-direction.

The source connection portion 44 extends from an end of the second source extension portion 43 on one side in the x-direction to the other side in the z-direction, and connects the second source extension portion 43 and the source terminal portion 45. The source terminal portion 45 extends from an end of the source connection portion 44 on the other side in the z-direction to one side in the x-direction, and projects from the fifth resin part surface 95 of the resin part 9. The source terminal portion 45 is used as a terminal connected to an external circuit when mounting the semiconductor device A1, etc. The source terminal portion 45 overlaps the first drain bonding portion 51 of the first drain lead 5 when viewed in the x-direction. The source terminal portion 45 overlaps the first drain terminal portion 52 of the first drain lead 5 when viewed in the y-direction.

<Control Lead 8>

The control lead 8 is a lead for electrically connecting the second control electrode 72 of the control element 7 to an outside. In the present embodiment, the semiconductor device A1 includes two control leads 8. The two control leads 8 are arranged to be apart from one side with respect to the die bonding portion 53 of the first drain lead 5 in the y-direction. The two control leads 8 are lined up in the x-direction.

The two control leads 8 are connected to the two second control electrodes 72 of the control element 7 by two control wires 89, respectively. The control wires 89 are made of a metal such as Au.

Next, the operation of the semiconductor device A1 will be described.

According to the present embodiment, the first gate electrode 11 of the first semiconductor element 1 and the second gate electrode 21 of the second semiconductor element 2 face each other. The gate bonding portion 31 of the gate lead 3 is disposed between the first gate electrode 11 and the second gate electrode 21, and the first gate electrode 11 and the second gate electrode 21 are bonded on both surfaces of the gate bonding portion 31 in the z-direction, respectively. Further, the first source electrode 12 of the first semiconductor element 1 and the second source electrode 22 of the second semiconductor element 2 face each other. The source bonding portion 41 of the source lead 4 is disposed between the first source electrode 12 and the second source electrode 22, and the first source electrode 12 and the second source electrode 22 are bonded on both surfaces of the source bonding portion 41 in the z-direction, respectively. As a result, the gate bonding portion 31, which is a conduction path between the first gate electrode 11 and the second gate electrode 21, and the source bonding portion 41, which is a conduction path between the first source electrode 12 and the second source electrode 22, are relatively small in dimension in the z-direction. Further, it is possible to reduce the resistance and the inductance of the conduction path between the first gate electrode 11 and the second gate electrode 21 and the conduction path between the first source electrode 12 and the second source electrode 22. Therefore, the semiconductor device A1 can be downsized and the resistance and the inductance can be reduced.

The first drain bonding portion 51 of the first drain lead 5 and the second drain bonding portion 61 of the second drain lead 6 are respectively arranged on opposite sides in the z-direction with the first semiconductor element 1 and the second semiconductor element 2 interposed therebetween. Therefore, it is possible to prevent the first drain lead 5 and the second drain lead 6 from interfering with the gate lead 3 and the source lead 4.

Since the first gate electrode 11 and the second gate electrode 21 are configured to overlap each other when viewed in the z-direction, the gate bonding portion 31 bonded to the first gate electrode 11 and the second gate electrode 21 can be suppressed from being excessively large. In addition, since the first source electrode 12 and the second source electrode 22 are configured to overlap each other when viewed in the z-direction, the source bonding portion 41 bonded to the first source electrode 12 and the second source electrode 22 can be suppressed from being excessively large.

By providing the semiconductor device A1 with the control element 7, it is possible to reduce the size of the entire circuit including the semiconductor device A1 while enhancing the functionality of the semiconductor device A1. The gate lead 3 has the gate bonding portion 31 and the control bonding portion 34, and is conductively bonded to the first gate electrode 11 of the first semiconductor element 1, the second gate electrode 21 of the second semiconductor element 2, and the first control electrode 71 of the control element 7. As a result, the resistance and the inductance of a conduction path between the first gate electrode 11 and the second gate electrode 21, and the first control electrode 71 can be reduced.

FIGS. 9 to 15 show another embodiment of the present disclosure. In these figures, the same or similar elements as those in the above-described embodiment are denoted by the same reference numerals as those in the above-described embodiment.

Second Embodiment

FIGS. 9 to 15 show a semiconductor device according to a second embodiment of the present disclosure. The semiconductor device A2 of the present embodiment includes a first semiconductor element 1, a second semiconductor element 2, a gate lead 3, a source lead 4, a first drain lead 5, a second drain lead 6, and a resin part 9. The control element 7 and the control lead 8 in the semiconductor device A1 are not included.

The first drain lead 5 of the semiconductor device A2 has a first drain bonding portion 51 and a first drain terminal portion 52, and does not have the die bonding portion 53 in the semiconductor device A1.

The gate lead 3 of the semiconductor device A2 has a gate bonding portion 31, a first gate extension portion 32, a gate connection portion 36, and a gate terminal portion 35.

The gate bonding portion 31 is located between the first gate electrode 11 of the first semiconductor element 1 and the second gate electrode 21 of the second semiconductor element 2 in the z-direction. The gate bonding portion 31 overlaps the first gate electrode 11 and the second gate electrode 21 when viewed in the z-direction. The first gate electrode 11 is conductively bonded to the gate bonding portion 31 via a bonding layer 119, and the second gate electrode 21 is conductively bonded to the gate bonding portion 31 via a bonding layer 219. The bonding layer 119 and the bonding layer 219 are made of a conductive bonding material, for example, solder, Ag paste, or the like.

The first gate extension portion 32 extends from the gate bonding portion 31 to the other side in the x-direction. The gate connection portion 36 extends from an end of the first gate extension portion 32 on the other side in the x-direction to the other side in the z-direction, and connects the first gate extension portion 32 and the gate terminal portion 35. The gate terminal portion 35 extends from an end of the gate connection portion 36 on the other side in the z-direction to the other side in the x-direction, and projects from the sixth resin part surface 96 of the resin part 9. The gate terminal portion 35 is used as a terminal connected to an external circuit when the semiconductor device A1 is mounted, or the like. The gate terminal portion 35 overlaps with the first drain bonding portion 51 of the first drain lead 5 when viewed in the x-direction. The gate terminal portion 35 overlaps the second drain terminal portion 64 of the second drain lead 6 when viewed in the y-direction.

Even according to the present embodiment, it is possible to downsize the semiconductor device A2 and reduce the resistance and the inductance thereof. Further, as understood from the present embodiment, the semiconductor device of the present disclosure may not incorporate the control element 7 and the control lead 8.

The semiconductor device according to the present disclosure is not limited to the above-described embodiments. The specific configuration of each part of the semiconductor devices according to the present disclosure can be modified in various ways in design.

[Supplemental Note 1]

A semiconductor device including:

a first semiconductor element including a first gate electrode, a first source electrode, and a first drain electrode;

a second semiconductor element including a second gate electrode, a second source electrode, and a second drain electrode;

a gate lead, a source lead, a first drain lead, and a second drain lead; and a resin part configured to cover the first semiconductor element and the second semiconductor element, and portions of the gate lead, the source lead, the first drain lead, and the second drain lead, wherein the first gate electrode and the first source electrode, and the first drain electrode are provided on opposite sides to each other in a first direction, wherein the second gate electrode and the second source electrode, and the second drain electrode are provided on opposite sides to each other in the first direction, wherein the first gate electrode and the second gate electrode are opposed to the first source electrode and the second source electrode, respectively, in the first direction, wherein the gate lead includes a gate bonding portion that is located between the first gate electrode and the second gate electrode in the first direction and is bonded to the first gate electrode and the second gate electrode, wherein the source lead includes a source bonding portion that is located between the first source electrode and the second source electrode in the first direction and is bonded to the first source electrode and the second source electrode, wherein the first drain lead has a first drain bonding portion bonded to the first drain electrode, and wherein the second drain lead has a second drain bonding portion bonded to the second drain electrode.

[Supplemental Note 2]

The semiconductor device of Supplemental Note 1, wherein the first semiconductor element and the second semiconductor element are P-channel type MOSFETs.

[Supplemental Note 3]

The semiconductor device of Supplemental Note 1 or 2, wherein the source lead includes a first source extension portion that extends from the source bonding portion to one side in a second direction that is perpendicular to the first direction.

[Supplemental Note 4]

The semiconductor device of Supplemental Note 3, wherein the source lead includes a second source extension portion that extends from the first source extension portion to one side in a third direction that is perpendicular to the first direction and the second direction.

[Supplemental Note 5]

The semiconductor device of Supplemental Note 4, wherein the source lead includes a source terminal portion that overlaps the first drain bonding portion in the third direction and projects from the resin part to one side in the third direction, and a source connection portion connected to the second source extension portion and the source terminal portion.

[Supplemental Note 6]

The semiconductor device of Supplemental Note 5, wherein the first drain lead includes a first drain terminal portion that extends from the first drain bonding portion to one side in the third direction and projects from the resin part to one side in the third direction.

[Supplemental Note 7]

The semiconductor device of Supplemental Note 6, wherein the source terminal portion and the first drain terminal portion overlap each other when viewed in the second direction.

[Supplemental Note 8]

The semiconductor device of Supplemental Note 7, wherein the gate lead includes a first gate extension portion that extends to the other side of the gate bonding portion in the third direction, and a gate terminal portion that projects from the resin part to the other side in the third direction.

[Supplemental Note 9]

The semiconductor device of Supplemental Note 8, wherein the second drain lead includes a second drain extension portion that extends from the second drain bonding portion to the other side in the third direction.

[Supplemental Note 10]

The semiconductor device of Supplemental Note 9, wherein the second drain lead includes a second drain terminal portion that overlaps the first drain bonding portion in the third direction and projects from the resin part to the other side in the third direction, and a second drain connection portion connected to the second drain extension portion and the second drain terminal portion.

[Supplemental Note 11]

The semiconductor device of Supplemental Note 10, wherein the gate terminal portion and the second drain terminal portion overlap each other when viewed in the second direction.

[Supplemental Note 12]

The semiconductor device of Supplemental Note 11, wherein the first drain lead includes a die bonding portion located on one side of the first drain bonding portion in the second direction, and wherein the semiconductor device further includes a control element including a first control electrode that is bonded to the die bonding portion and is located on an opposite side to the die bonding portion in the first direction.

[Supplemental Note 13]

The semiconductor device of Supplemental Note 12, wherein the gate lead includes a second gate extension portion that extends from the gate bonding portion to the other side in the second direction, and a control bonding portion connected to the second gate extension portion and bonded to the first control electrode, and wherein the first gate extension portion is connected to the control bonding portion.

[Supplemental Note 14]

The semiconductor device of Supplemental Note 13, wherein the control element includes at least one second control electrode located on one side of the first control electrode in the third direction, and wherein the semiconductor device further includes:

at least one control lead located on one side of the first drain lead in the second direction; and at least one control wire connected to the at least one second control electrode and the at least one control lead.

[Supplemental Note 15]

The semiconductor device of Supplemental Note 14, wherein the at least one second control electrode includes a plural number of second control electrodes, the at least one control lead includes a plural number of control leads, and the at least one control wire includes a plural number of control wires.

[Supplemental Note 16]

The semiconductor device of Supplemental Note 15, wherein any one of the plural number of control leads has a position in the third direction overlapping the first control electrode.

[Supplemental Note 17]

The semiconductor device of any one of Supplemental Notes 1 to 15, wherein the first source electrode is smaller than the first drain electrode.

[Supplemental Note 18]

The semiconductor device of any one of Supplemental Notes 1 to 16, wherein the second source electrode is smaller than the second drain electrode.

According to the present disclosure in some embodiments, it is possible to achieve downsizing and reduction of resistance and inductance.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:

a first semiconductor element including a first gate electrode, a first source electrode, and a first drain electrode;

a second semiconductor element including a second gate electrode, a second source electrode, and a second drain electrode;

a gate lead, a source lead, a first drain lead, and a second drain lead; and a resin part configured to cover the first semiconductor element and the second semiconductor element, and portions of the gate lead, the source lead, the first drain lead, and the second drain lead, wherein the first gate electrode and the first source electrode, and the first drain electrode are provided on opposite sides to each other in a first direction, wherein the second gate electrode and the second source electrode, and the second drain electrode are provided on opposite sides to each other in the first direction, wherein the first gate electrode and the second gate electrode are opposed to the first source electrode and the second source electrode, respectively, in the first direction, wherein the gate lead includes a gate bonding portion that is located between the first gate electrode and the second gate electrode in the first direction and is bonded to the first gate electrode and the second gate electrode, wherein the source lead includes a source bonding portion that is located between the first source electrode and the second source electrode in the first direction and is bonded to the first source electrode and the second source electrode, wherein the first drain lead has a first drain bonding portion bonded to the first drain electrode, wherein the second drain lead has a second drain bonding portion bonded to the second drain electrode, wherein the source lead includes a first source extension portion that extends from the source bonding portion to one side in a second direction that is perpendicular to the first direction, wherein the first drain lead includes a die bonding portion located on one side of the first drain bonding portion in the second direction, and wherein the semiconductor device further comprises a control element including a first control electrode that is bonded to the die bonding portion and is located on an opposite side to the die bonding portion in the first direction.

2. The semiconductor device of claim 1, wherein the first semiconductor element and the second semiconductor element are P-channel type MOSFETs.

3. The semiconductor device of claim 1, wherein the source lead includes a second source extension portion that extends from the first source extension portion to one side in a third direction that is perpendicular to the first direction and the second direction.

4. The semiconductor device of claim 3, wherein the source lead includes a source terminal portion that overlaps the first drain bonding portion in the third direction and projects from the resin part to one side in the third direction, and a source connection portion connected to the second source extension portion and the source terminal portion.

5. The semiconductor device of claim 4, wherein the first drain lead includes a first drain terminal portion that extends from the first drain bonding portion to one side in the third direction and projects from the resin part to one side in the third direction.

6. The semiconductor device of claim 5, wherein the source terminal portion and the first drain terminal portion overlap each other when viewed in the second direction.

7. The semiconductor device of claim 6, wherein the gate lead includes a first gate extension portion that extends to the other side of the gate bonding portion in the third direction, and a gate terminal portion that projects from the resin part to the other side in the third direction.

8. The semiconductor device of claim 7, wherein the second drain lead includes a second drain extension portion that extends from the second drain bonding portion to the other side in the third direction.

9. The semiconductor device of claim 8, wherein the second drain lead includes a second drain terminal portion that overlaps the first drain bonding portion in the third direction and projects from the resin part to the other side in the third direction, and a second drain connection portion connected to the second drain extension portion and the second drain terminal portion.

10. The semiconductor device of claim 9, wherein the gate terminal portion and the second drain terminal portion overlap each other when viewed in the second direction.

11. The semiconductor device of claim 1, wherein the gate lead includes a first gate extension portion that extends to the other side of the gate bonding portion in a third direction that is perpendicular to the first direction and the second direction, wherein the gate lead includes a second gate extension portion that extends from the gate bonding portion to the other side in the second direction, and a control bonding portion connected to the second gate extension portion and bonded to the first control electrode, and wherein the first gate extension portion is connected to the control bonding portion.

12. The semiconductor device of claim 11, wherein the control element includes at least one second control electrode located on one side of the first control electrode in the third direction, and wherein the semiconductor device further comprises:

at least one control lead located on one side of the first drain lead in the second direction; and at least one control wire connected to the at least one second control electrode and the at least one control lead.

13. The semiconductor device of claim 12, wherein the at least one second control electrode includes a plural number of second control electrodes, the at least one control lead includes a plural number of control leads, and the at least one control wire includes a plural number of control wires.

14. The semiconductor device of claim 13, wherein any one of the plural number of control leads has a position in the third direction overlapping the first control electrode.

15. The semiconductor device of claim 1, wherein the first source electrode is smaller than the first drain electrode.

16. The semiconductor device of claim 1, wherein the second source electrode is smaller than the second drain electrode.

* * * * *